(12) United States Patent
Balakrishnan et al.

(10) Patent No.: US 12,437,999 B2
(45) Date of Patent: Oct. 7, 2025

(54) METHODS AND APPARATUS FOR MASK PATTERNING DEBRIS REMOVAL

(71) Applicant: Applied Materials, Inc., Santa Clara, CA (US)

(72) Inventors: Karthik Narayanan Balakrishnan, Singapore (SG); Jungrae Park, Cupertino, CA (US); Arunkumar Tatti, Bangalore (IN); Sriskantharajah Thirunavukarasu, Singapore (SG); Eng Sheng Peh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/765,888

(22) Filed: Jul. 8, 2024

(65) Prior Publication Data
US 2024/0363348 A1 Oct. 31, 2024

Related U.S. Application Data

(62) Division of application No. 17/219,082, filed on Mar. 31, 2021, now Pat. No. 12,068,159.

(51) Int. Cl.
*H01L 21/033* (2006.01)
*B23K 26/14* (2014.01)
(Continued)

(52) U.S. Cl.
CPC ........ *H01L 21/0337* (2013.01); *B23K 26/142* (2015.10); *B23K 26/1436* (2015.10);
(Continued)

(58) Field of Classification Search
CPC ... H01L 21/0337; H01L 21/78; B23K 26/142; B23K 26/1436; B23K 26/1437; B23K 2101/40
(Continued)

(56) References Cited

U.S. PATENT DOCUMENTS 6,111,214 A * 8/2000 Saito .................... B23K 26/147
219/121.72
8,883,615 B1 11/2014 Holden et al.
(Continued)

FOREIGN PATENT DOCUMENTS

| KR | 101789111 | * 10/2017 |
| WO | WO 2006002168 | * 1/2006 |
| WO | WO 2021113281 | * 6/2021 |

*Primary Examiner* — Sheng-Bai Zhu
(74) *Attorney, Agent, or Firm* — Moser Taboada

(57) ABSTRACT

Methods and apparatus for laser patterning leverage mask trench debris removal techniques to form etch singulation trenches. In some embodiments, the method includes forming a mask layer on the wafer, forming a pattern in the mask layer using a laser of a laser assembly where the pattern allows singulation of the wafer by deep etching and forms a trench in the mask layer with a laser beam which has a process point at a bottom of the trench, directing gas nozzles that flow a pressurized gas at the process point in the trench as the pattern is formed with a gas flow angle relative to the process point and evacuating debris from the trench using an area of negative pressure where the gas flow from gas nozzles and the area of negative pressure are in fluid contact and are confined within a cylindrical housing.

12 Claims, 8 Drawing Sheets

(51) Int. Cl.
*B23K 26/142* (2014.01)
*B23K 101/40* (2006.01)
*H01L 21/78* (2006.01)

(52) U.S. Cl.
CPC .......... *B23K 26/1437* (2015.10); *H01L 21/78* (2013.01); *B23K 2101/40* (2018.08)

(58) Field of Classification Search
USPC ........................................................ 438/460
See application file for complete search history.

(56) References Cited

U.S. PATENT DOCUMENTS

| | | |
|---|---|---|
| 9,041,198 B2 | 5/2015 | Lei et al. |
| 10,926,353 B2 | 2/2021 | Rasmussen |
| 2001/0035401 A1* | 11/2001 | Manor ................... B28D 1/221 219/121.72 |
| 2002/0179582 A1* | 12/2002 | Reichmann ........ B23K 26/1476 219/121.84 |
| 2008/0213978 A1* | 9/2008 | Henry .................... B23K 26/40 257/E21.238 |
| 2012/0322235 A1 | 12/2012 | Lei et al. |
| 2016/0141210 A1* | 5/2016 | Lei .................... H01L 21/67207 438/462 |
| 2017/0209961 A1 | 7/2017 | Cavanaugh |
| 2018/0111225 A1* | 4/2018 | Rasmussen ............ B23K 26/38 |

\* cited by examiner

METHODS AND APPARATUS FOR MASK PATTERNING DEBRIS REMOVAL

CROSS-REFERENCE TO RELATED APPLICATIONS

This application is a divisional of co-pending U.S. patent application Ser. No. 17/219,082 filed Mar. 31, 2021, which is herein incorporated by reference.

FIELD

Embodiments of the present principles generally relate to semiconductor manufacturing.

BACKGROUND

Many individual circuits can be formed on a single wafer. The individual circuits may be constructed to function independently of other circuits formed on the wafer. Thus, separating the circuits into individual pieces may be required. During back end of the line (BEOL) processing of the wafer, the wafer may be cut apart or singulated into individual dies. In some processes, the separation of the circuits may be performed with a saw. The saw produces smooth sidewall cuts but the kerf may be quite wide, reducing the number of circuits possible on a wafer. Other processes may use lasers to score the top surface of the wafer followed by mechanical leveraging to cause breakage along the score line. Yet another type of process uses a mask formed on the wafer and a laser to pattern the mask so that a subsequent etching process can be used to singulate the wafer. The inventors have observed, however, that during the mask patterning, the laser may leave behind debris in the pattern causing problems during the subsequent etching process for singulation.

Accordingly, the inventors have provided methods and apparatus for efficient removal of debris from the mask pattern, leading to superior singulation performance.

SUMMARY

Methods and apparatus for mask pattern debris removal are provided herein.

In some embodiments, a method of a patterning a mask on a wafer may include forming a mask layer on the wafer, forming a pattern in the mask layer using a laser beam from a laser assembly, wherein the pattern is configured to allow singulation of the wafer by deep etching, wherein the laser assembly forms at least one trench in the mask layer with the laser beam, and wherein the laser beam has a process point at a bottom of the at least one trench, directing one or more gas nozzles that flow a pressurized gas at the process point in the at least one trench as the pattern is formed, wherein the one or more gas nozzles form a gas flow angle relative to the process point, and evacuating debris from the at least one trench using at least one area of negative pressure, wherein gas flow from the one or more gas nozzles and the at least one area of negative pressure are in fluid contact and are confined within a cylindrical housing, wherein the cylindrical housing has a partially enclosed end distal to the process point that is sealed by and attached to the laser assembly via an opening in the partially enclosed end, and wherein the cylindrical housing moves in conjunction with the laser assembly above the process point.

In some embodiments, the method may further include wherein the gas flow angle is approximately 60 degrees to approximately 85 degrees, wherein the gas flow angle is approximately 75 degrees to less than 90 degrees, wherein the pressurized gas is at a pressure of approximately 5 psi to approximately 30 psi, wherein the pressurized gas is at a pressure of approximately 5 psi to approximately 15 psi, wherein the pressurized gas is supplied by a gas source at an ambient temperature, wherein the at least one area of negative pressure is positioned opposite the one or more gas nozzles in the cylindrical housing, wherein the at least one area of negative pressure is an annular area around an inner circumference of the cylindrical housing at the partially enclosed end, wherein the pressurized gas is an inert gas, wherein the pressurized gas is argon gas or nitrogen gas, wherein the one or more gas nozzles are positioned in the partially enclosed end of the cylindrical housing in an annular orientation and configured to surround the process point with gas flow, and/or wherein a plurality of negative pressure areas is interspersed with a plurality of gas nozzles.

In some embodiments, an apparatus for a mask patterning laser may include a cylindrical housing with a partially enclosed end with an annular collar with a central opening configured to engage over an outer portion of a housing of a lens assembly of the mask patterning laser and seal the partially enclosed end, a first extension on an outer surface of the cylindrical housing, the first extension has an angled top surface that slopes downward from a top surface of the partially enclosed end outward and a first opening in the first extension extending downward from the top surface of the partially enclosed end and at an angle to the central opening and configured to supply pressurized gas at a focal point of the mask patterning laser, and a second extension on the outer surface of the cylindrical housing, the second extension positioned opposite the first extension with an angled top surface that slopes downward from the top surface of the partially enclosed end outward and a second opening in the second extension extending downward from the top surface of the partially enclosed end and at an angle to the central opening and configured to exhaust debris from the focal point of the mask patterning laser.

In some embodiments, the apparatus may further include wherein the first extension is configured to flow pressurized gas at an angle of approximately 60 degrees to approximately 85 degrees toward a center of an open end of the cylindrical housing that is distal to the partially enclosed end, and/or wherein the first extension is configured to flow pressurized gas at an angle of approximately 75 degrees to less than 90 degrees toward a center of an open end of the cylindrical housing that is distal to the partially enclosed end.

In some embodiments, an apparatus for a mask patterning laser may include a cylindrical housing with a partially enclosed end with an annular collar with a central opening configured to engage over an outer portion of a housing of a lens assembly of the mask patterning laser and seal the partially enclosed end, at least one gas inlet port on a top surface of the partially enclosed end that is fluidly coupled to a gas distribution plenum positioned within the partially enclosed end of the cylindrical housing and wherein the gas distribution plenum is fluidly coupled to a plurality of gas nozzles surrounding the central opening that supply pressurized gas directed inward and downward, and at least one evacuation port on the top surface of the partially enclosed end that is fluidly coupled to one or more negative pressure areas within the cylindrical housing.

In some embodiments, the apparatus may further include wherein the plurality of gas nozzles supply pressurized gas at an angle of approximately 60 degrees to approximately 85 degrees relative to the partially enclosed end, wherein the plurality of gas nozzles are configured to supply pressurized gas at an angle of approximately 75 degrees to less than 90 degrees relative to the partially enclosed end, wherein a negative pressure area forms a negative pressure channel around an inner circumference of the cylindrical housing at the partially enclosed end, and/or a negative pressure plenum fluidly coupled to the at least one evacuation port and fluidly coupled to a plurality of debris evacuation inlets on an inner surface of the partially enclosed end.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
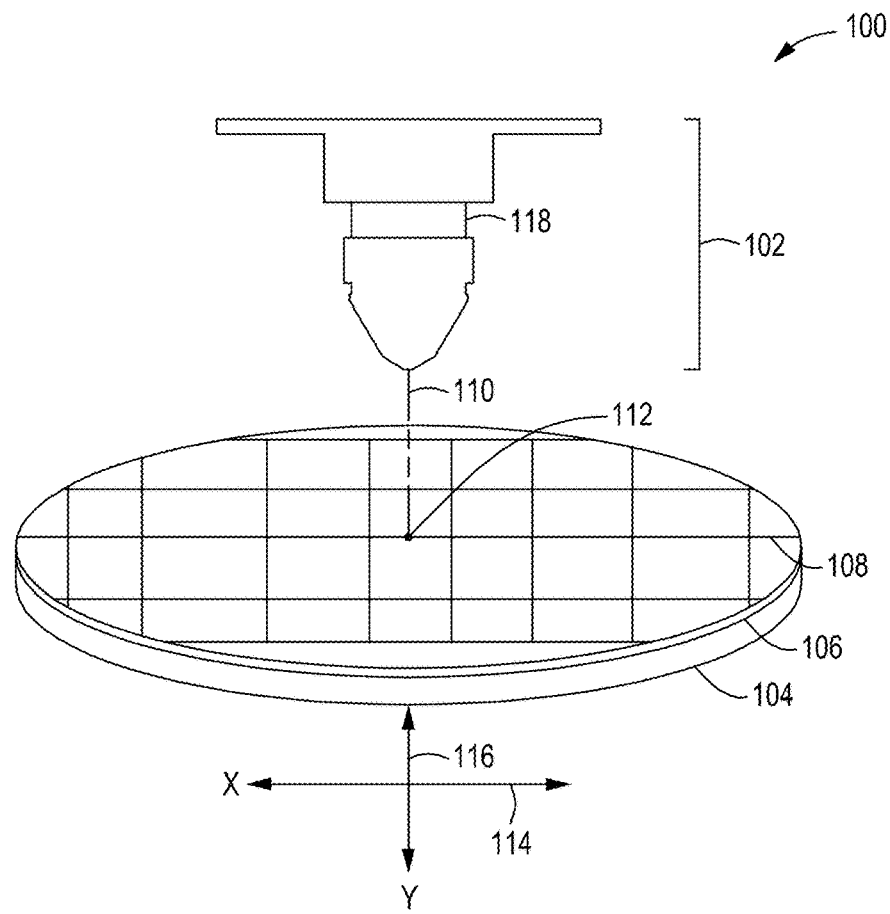
FIG. 1 depicts an isometric view of mask patterning with a laser in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus of the present principles provide debris removal that occurs during mask patterning used in etch dicing of circuits on a wafer. By efficiently and effectively removing the debris from trenches forming the mask pattern, the patterning becomes a low energy process by requiring only a single pass of the laser to form precise trenches in the mask. The single laser pass also promotes narrower trench formation (reduced kerf) which reduces the wafer real estate required for the pattern and increases the number of circuits that can be formed on the wafer. Single pass mask patterning reduces the time spent on wafer dicing as well, increasing throughput and reducing operating costs.

In an etch dicing process, the wafer is typically cleaned using an ozone plasma treatment in preparation for forming the mask. The mask material may be sprayed or otherwise deposited on the wafer's top surface. The mask is then heated to cure the mask material. A laser, such as a femtosecond laser, is used to pattern the mask around areas that are to be singulated. A deep etch process is then performed on the wafer using high density plasma to deep etch areas of the wafer not protected by the mask (trench areas formed by the laser). The mask is then removed, leaving the singulated die. The inventors have found that if debris is left in the mask trenches during the mask patterning process, the deep etch process will not be as effective, causing singulation problems. In addition, if debris is located and attempts are made to use the laser to remove the debris in a second or third pass, the kerf will be enlarged with each pass and the energy expended into the wafer will be increased, possibly damaging the circuits on the wafer and also increasing the mask pattern surface area, reducing the area for circuit formation.

The inventors have discovered that mask trench debris may be actively removed during the mask patterning process by using a combination of active purging with a gas and exhausting with a negative pressure that is distributed evenly around the process point (location at which the laser beam is coincident on the wafer). The inventors have found that in order for the debris to be effectively removed, the purging gas and exhaust should be close to the focal point of the laser as the mask pattern is formed while maintaining the exhaust vacuum. As the mask material is typically water soluble, the purging gas should be non-reactive with the mask. In addition, the mask-to-wafer interface is fragile and forcing high pressure purging gas at the interface may lead to damage and delamination of the mask from the wafer. The methods and apparatus of the present principles provide an integrated purge and exhaust apparatus that is designed to provide symmetric flow of purge gas and exhaust around the process point to allow efficient removal of debris from the trenches of the mask.

Figure 2:
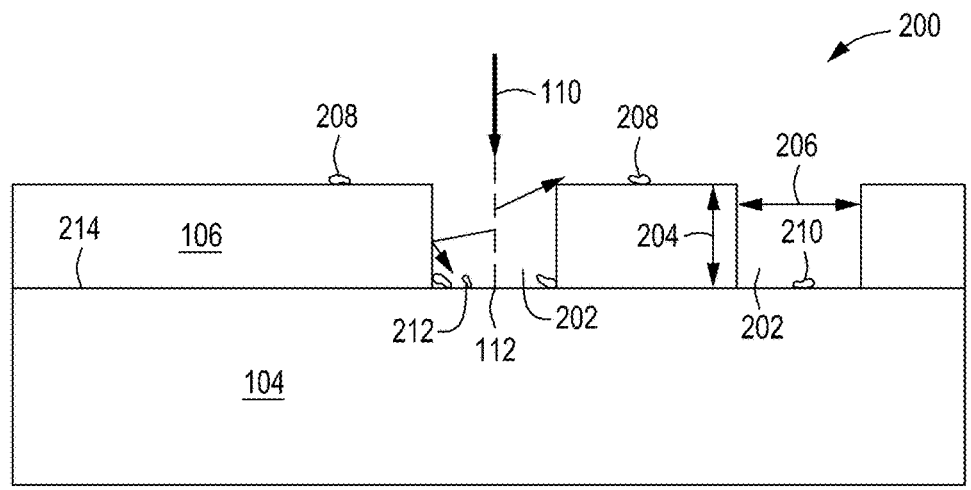
FIG. 2 depicts a cross-sectional view of debris in a mask trench in accordance with some embodiments of the present principles.

FIG. 1 depicts a view 100 of mask patterning with a laser in accordance with some embodiments. As described above, a wafer 104 is processed to form a mask 106 on an upper surface of the wafer 104. The wafer 104 is placed on a support that is movable in any direction in an X 114/Y 116 plane. A laser assembly 102 is stationary and produces a laser beam 110 by passing the laser light through a lens assembly 118. The laser beam 110 interacts with the mask 106 at a process point 112 to produce trenches 108 on the mask 106. The laser assembly 102 remains stationary, as the wafer 104 moves under the laser assembly 102 to form the "streets" of the mask pattern. In a view 200 of FIG. 2, trench debris 210, 212 in a mask trench 202 is depicted in accordance with some embodiments. In some cases, top debris 208 may occur as well. The top debris 208, however, is not as critical as the trench debris 210, 212 because the mask 106 protects the top surface 214 of the wafer 104. In mechanical breaking singulation processes, the top surface is not protected and top debris can cause damage to the circuits on the wafer. As the top surface 214 is protected in deep etch singulation processes, reducing/eliminating debris left in the mask trench currently being lased and reducing/eliminating debris scattered to other trenches are the focus of the methods and apparatus of the present principles.

In some embodiments, the height 204 of the mask trench 202 is nominally the thickness of the mask 106 which is approximately 6 nm to approximately 10 nm, and the width 206 or kerf is approximately 6 nm to approximately 10 nm. However, if a mask trench is not clean, the laser beam 110 may be rerun in a low power mode over the mask trench. In doing so, a 'drop zone' for the laser beam 110 is formed where the laser beam 110 is restarted, widening the trench width to approximately 16 nm to 20 nm. In addition, the mask and circuits on the wafer absorb more heat with each laser pass, possibly damaging the mask and circuits. Creating a clean mask trench with a single laser pass is critical to providing precise and accurate mask patterns.

Figure 3:
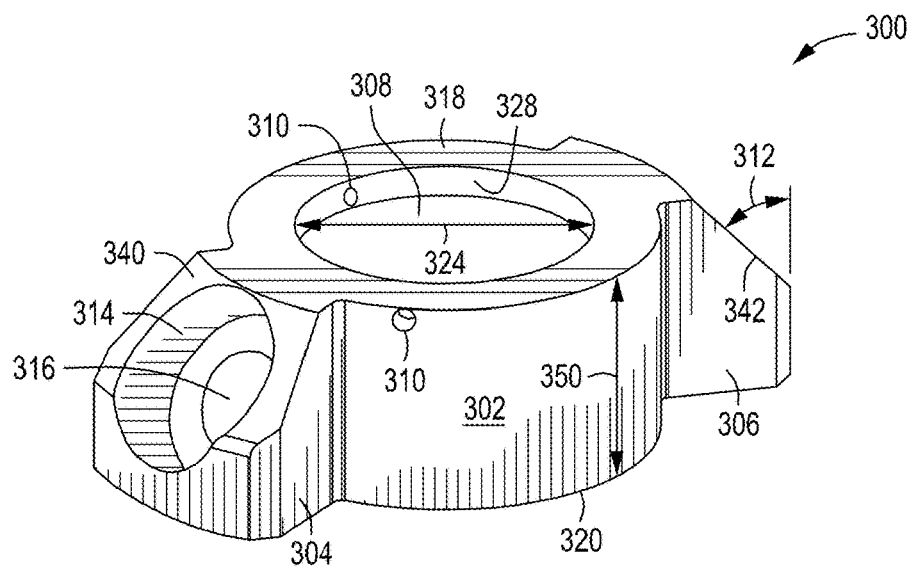
FIG. 3 depicts an isometric view of a mask trench debris removal apparatus in accordance with some embodiments of the present principles.

FIG. 3 depicts a view of a debris removal apparatus 300 for a mask trench in accordance with some embodiments. References will be made to FIG. 4 which depicts a view 400 of the debris removal apparatus 300 in-situ. The debris removal apparatus 300 has a cylindrical main body 302 with a first protrusion 304 and a second protrusion 306. The cylindrical main body 302 is at least partially enclosed at one end by a top surface 318. The cylindrical main body 302 facilitates in allowing gases and debris to flow within the debris removal apparatus 300 unimpeded. The cylindrical main body 302 forms a debris removal volume where both active purging and debris removal can occur within the same volume close to the process point 112 to contain the purging and removal of the debris to prevent undesirable debris scattering to other close by trenches. The enclosed volume also ensures maximum effect of the negative pressure areas of the debris removal apparatus 300. The inventors have found that the smaller the debris removal volume, the more efficient the debris removal.

In some embodiments, the debris removal apparatus 300 is formed from a metallic material such as, but not limited to, aluminum and the like because the debris removal apparatus 300 is not subjected to high heat environments and does not need to function as a thermal barrier. In some embodiments, the cylindrical main body 302 has a height 350 of approximately 20 to approximately 100. The dimensions are driven by the components of the laser assembly 102, such as the location of the lens in reference to the wafer (working distance of the lens) and may vary accordingly. The use of protrusions allows the cylindrical main body 302 to be reduced in diameter to allow gas insertion and debris removal as close to the process point 112 as possible while allowing connection points for the gas supply and the evacuation. The debris removal apparatus 300 can also be scaled down as the size of the laser assembly decreases. The debris removal apparatus 300 has a top surface 318 with a first opening 308 with a first diameter 324. In some embodiments, the first diameter 324 may be from approximately 30 mm to approximately 50 mm. The first diameter 324 is driven by the dimensions of the lens of the laser assembly 102 and may vary. The bottom surface 320 of the cylindrical main body 302 has a second opening 322 (see FIG. 4) that has a second diameter 326 which is equal to or greater than the first diameter 324. In some embodiments, the second diameter 326 may be from approximately 30 mm to approximately 50 mm. The reduced diameter of the first opening 308 provides an inner surface 328 that forms a seal when attached around the laser assembly 102 to fully seal the partially enclosed end. In some embodiments, one or more attachment holes 310 may be provided to affix the debris removal apparatus 300 to the laser assembly 102. Other attachment methods may be used as well such as friction fit, clamping, adhesive, and the like.

Figure 13:
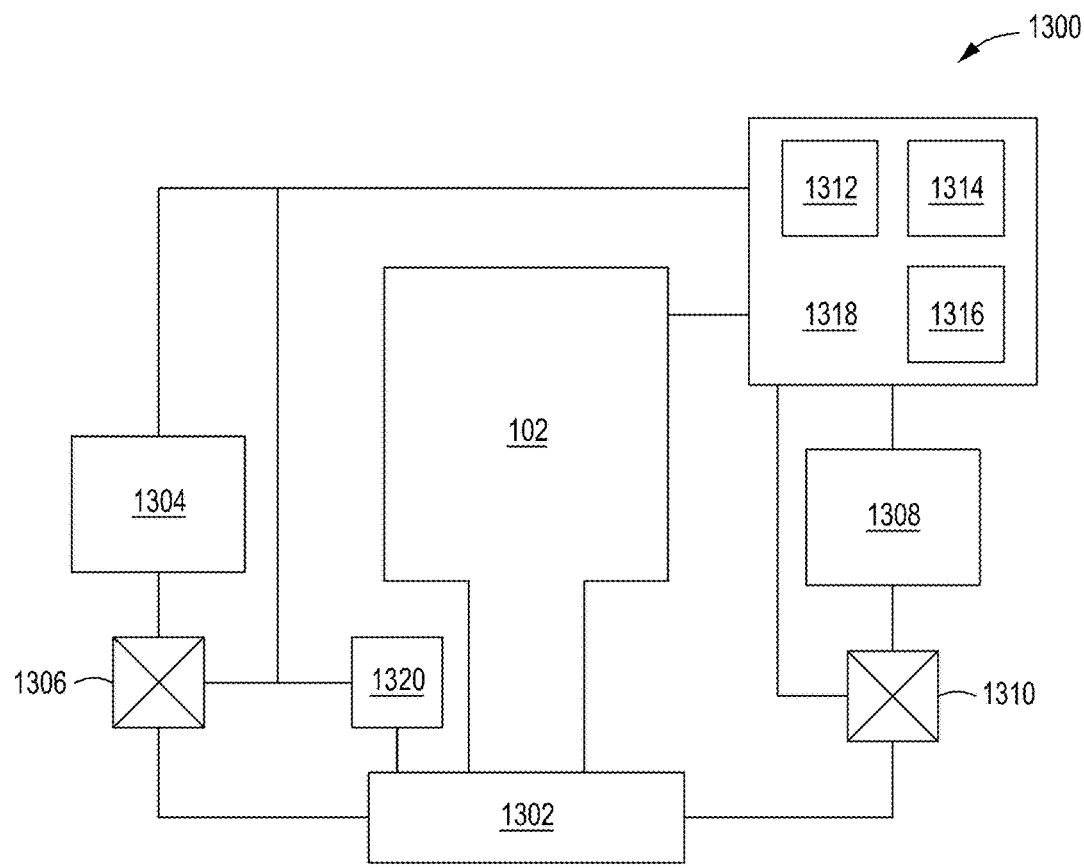
FIG. 13 depicts a cross-sectional view of a mask patterning system in accordance with some embodiments of the present principles.

In some embodiments, the first protrusion 304 may have one or more openings with differing diameters such as, for example, opening 314 and opening 316 to allow attachment of a gas supply source (e.g., see FIG. 13). Opening 316 may be utilized as a nozzle to direct pressurized gas flow toward the process point 112 to dislodge debris from the mask trench. As such, the opening 316 may have an angle 416 of approximately 60 degrees to approximately 85 degrees. In some embodiments, the angle 416 may be from approximately 75 degrees to less than 90 degrees. The higher the angle, the more effectively the gas flow can be focused on the process point 112. In some embodiments, the second protrusion 306 may have one or more openings with differing diameters such as, for example, opening 330 and opening 332 to allow attachment of an exhaust extractor (e.g., see FIG. 13). As used herein and throughout for various embodiments, one skilled in the art will understand that an angle relative to the top surface of the mask 106 is also the same angle relative to the top surface of the wafer 104.

Opening 332 may be utilized as a vacuum duct to remove gas and debris away from the process point 112. In some embodiments, the angle 418 may be from approximately 30 degrees to less than 90 degrees. With extraction, the amount of the angle is less critical than the angle 416 of the gas direction. The negative pressure and seal of the inner surface 328 along with the distance 412 above the mask surface 420 will determine the suction and the effectiveness of the debris removal. For example, if the distance 412 of the debris removal apparatus 300 is too high above the mask surface 420, the negative pressure will begin to draw in substantial amounts of ambient air rather than debris from the mask trench. In some embodiments, the upper surface 340 of the first protrusion 304 and the upper surface 342 of the second protrusion may have an angle 312 of approximately 45 degrees to approximately 60 degrees to aid in attaching a gas supply source and exhaust, respectively.

Figure 4:
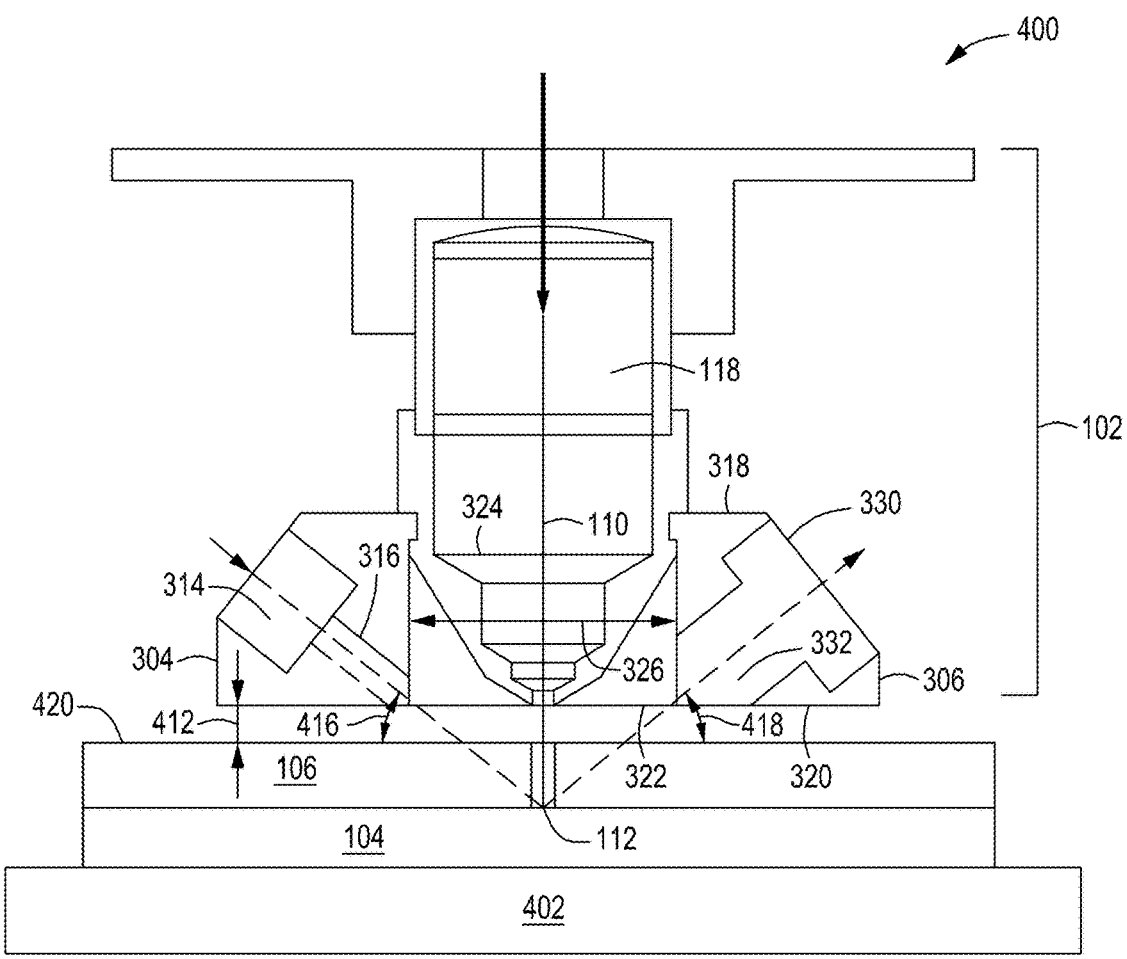
FIG. 4 depicts a cross-sectional view of a mask trench debris removal apparatus in-situ in accordance with some embodiments of the present principles.

As depicted in FIG. 4, the wafer 104 is supported by a wafer support 402 that is movable in an X-Y plane. The debris removal apparatus 300 is designed such that the gas flow and evacuation occur with high performance regardless of the direction in which the laser is forming a trench in the mask 106. In other words, the debris removal apparatus 300 does not need to maintain an orientation that is in front of, behind, or to the side of the laser beam to be effective. In some embodiments, additional protrusions may be added to allow more gas flow input ports and extraction ports on the debris removal apparatus 300 to further improve debris removal. Additional gas flow input ports allow for higher flow volume while maintaining a lower pressure to protect the mask 106.

Figure 5:
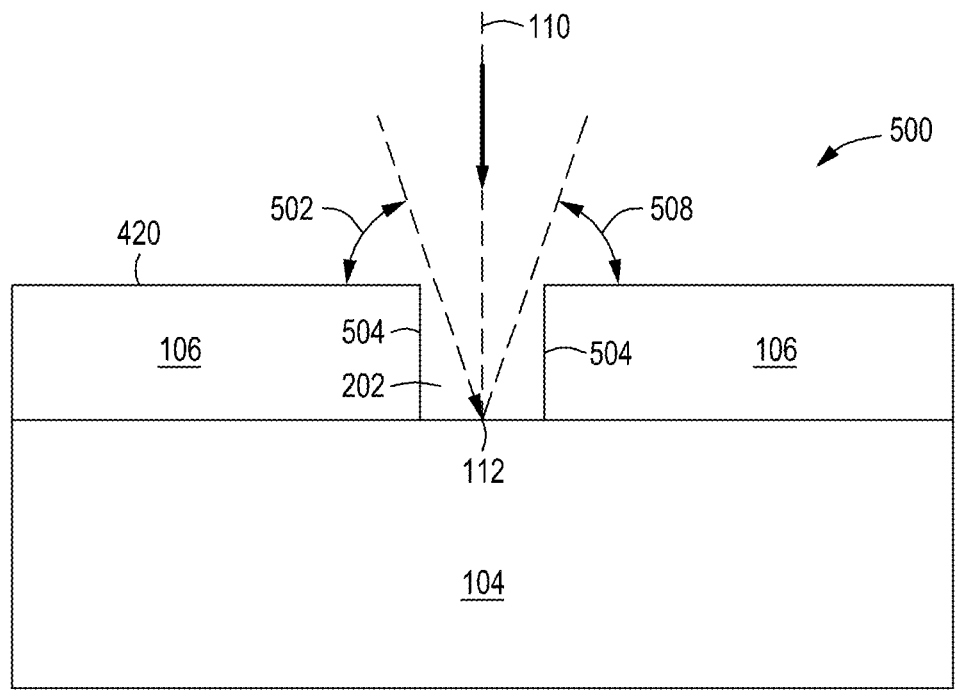
FIG. 5 depicts a cross-sectional view of a gas flow angle and an extraction angle in a mask trench in accordance with some embodiments of the present principles.

FIG. 5 depicts a view 500 of a gas flow angle 502 and a departure angle 508 in a mask trench 202 in accordance with some embodiments. In order for the gas flow to be directed at the process point 112, the gas flow angle 502 should have a high angle value in order to 'see over' the sidewalls 504 of the mask trench 202. The inventors have found that if the gas flow is directed at the process point 112, the materials that are vaporized by the laser can be removed before the materials have a chance to solidify or amalgamate with other particles and stick to the trench sidewalls or bottoms. Lower angle values may result in a majority of the directed gas to flow over the mask trench 202 rather than into the mask trench 202. Debris and gases within the mask trench 202 should have a departure angle 508 with a high angle value as well so that the debris and gases can purged out of the mask trench 202. The inventors have found that higher angles incident to the process point 112 more efficiently remove debris and gases from the mask trench 202. In some embodiments, the higher angle values also allow the gas flow and extraction to be closer to the process point 112 (increasing efficiency of the gas flow and debris removal) and allow the size of the debris removal apparatus 300 to be physically smaller. As noted above, in some embodiments, the gas flow angle 502 may be from approximately 60 degrees to less than approximately 85 degrees. In some embodiments, the gas flow angle 502 may be from approximately 75 degrees to less than 90 degrees.

Figure 6:
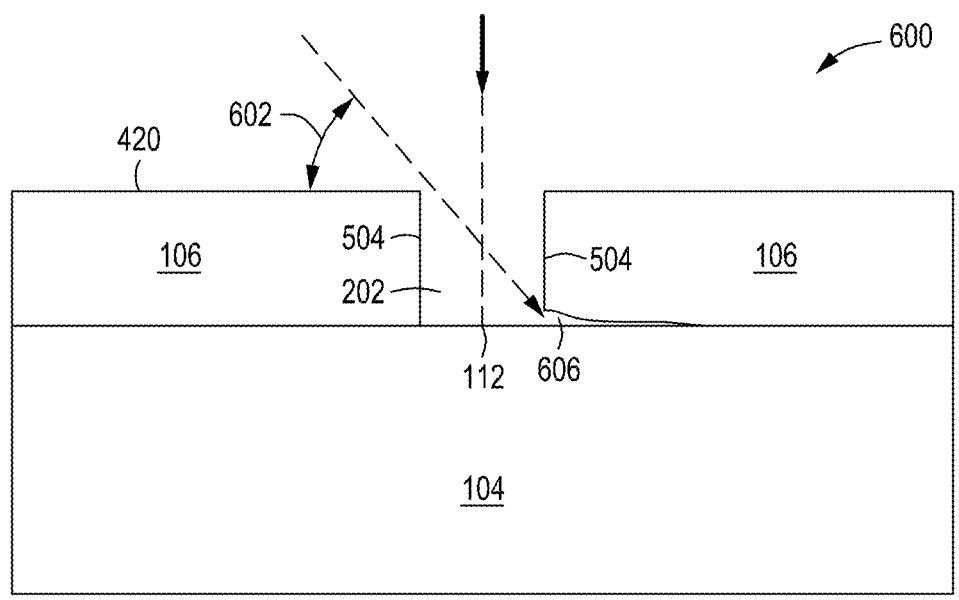
FIG. 6 depicts a cross-sectional view of a gas flow damaging a mask in accordance with some embodiments of the present principles.

The inventors have also found that the pressure of the gas flow may damage the mask 106 as depicted in a view 600 of FIG. 6. The interface 604 between the wafer 104 and the mask 106 can be easily damaged by directing (e.g., angle 602) high pressure gas at the sides 504 of the mask trench 202. In some cases, the mask 106 may be delaminated 606 from the wafer surface by the pressurized gas flow. The inventors have found that if the gas pressure is kept low, damage to the mask 106 can be reduced or eliminated. In some embodiments, the gas pressure is greater than zero to approximately 100 psi. In some embodiments, the gas pressure is approximately 5 to approximately 50 psi. In some embodiments, the gas pressure is approximately 5 psi to approximately 30 psi. In some embodiments, the gas pressure is approximately 5 psi to approximately 15 psi. The lower the pressure used, the less likely the mask 106 will be damaged. The pressure should be adjusted to a level sufficient to remove debris but no higher.

The type of gas utilized may also have a direct effect on the pressure used to prevent damage to the mask 106. If the gas reacts with the laser or the mask material or if the gas contains moisture (the mask is water soluble in some instances), the mask 106 may sustain damage, and the pressure should be kept low to reduce erosion and other types of damage to the mask 106. The inventors have found that inert gases such as, but not limited to, argon gas or nitrogen gas and the like may be used without damaging water soluble mask materials. The inventors have also found that adding particulates to the gas may also cause damage to the mask. In some embodiments, the gas is filtered to ensure that no particulates are in the gas. In some embodiments, the gas temperature at the process point 112 is also maintained high enough such that no particulates are formed in the gas due to low temperatures (e.g., frozen particles). In some embodiments, the gas temperature is maintained at approximately-25 degrees Celsius to approximately 100 degrees Celsius. In some embodiments, the gas temperature is maintained at approximately ambient temperature.

Figure 7:
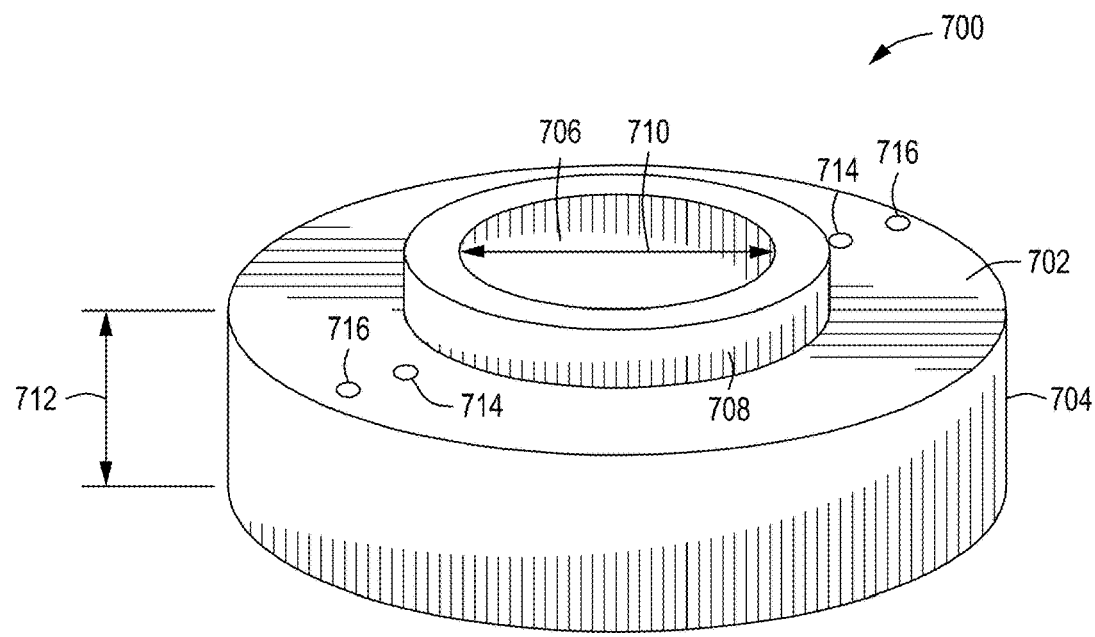
FIG. 7 depicts an isometric view of a top side of a mask trench debris removal apparatus in accordance with some embodiments of the present principles.

As higher pressure gas may damage the mask, increasing the volume of low pressure gas can increase the effectiveness of the debris removal. FIG. 7 depicts a view of a top side 702 of a debris removal apparatus 700 in accordance with some embodiments. The debris removal apparatus 700 has a cylindrical main body 704 with a partially enclosed end with an opening 706 on the top side 702. The cylindrical main body 704 facilitates in allowing gases and debris to flow within the debris removal apparatus 700 unimpeded. The debris removal apparatus 700 may be formed from a metallic or non-metallic material. In some embodiments, the debris removal apparatus 700 is formed from a metallic material such as, but not limited to, aluminum and the like because the debris removal apparatus 700 is not subjected to high heat environments. The cylindrical main body 704 forms a debris removal volume where both active purging and debris removal can occur within the same volume close to the process point 112 to contain the purging and removal of the debris to prevent undesirable debris scattering to other close by trenches. The enclosed volume also ensures maximum effect of the negative pressure areas of the debris removal apparatus 700. The inventors have found that the smaller the debris removal volume, the more efficient the debris removal.

Figure 8:
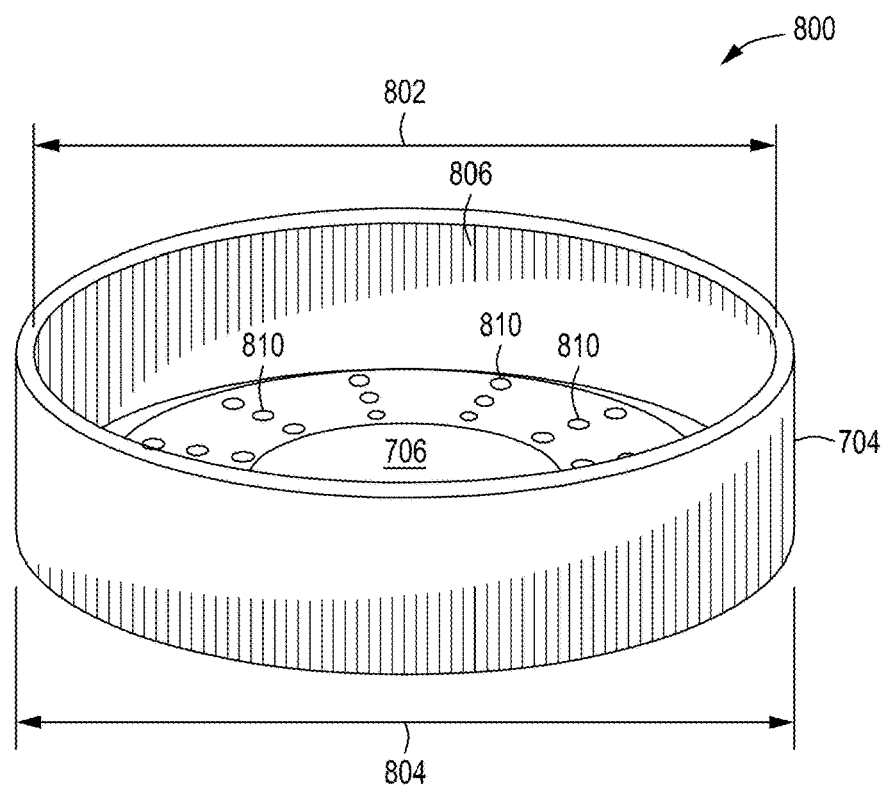
FIG. 8 depicts an isometric view of a bottom side of a mask trench debris removal apparatus in accordance with some embodiments of the present principles.

In some embodiments, the cylindrical main body 704 has a height 712 of approximately 20 mm to approximately 100 mm. The dimensions are driven by the components of the laser assembly 102, such as the location of the lens in reference to the wafer (working distance of the lens) and may vary accordingly. The opening 706 is surrounded by a collar 708 which engages with a laser assembly 102 to attach the debris removal apparatus 700 to the laser assembly 102 (see, e.g., FIG. 10) to fully seal the partially enclosed end. The opening 706 has a first diameter 710. In some embodiments, the first diameter 710 may be from approximately 30 mm to approximately 50 mm. The first diameter 710 is driven by the dimensions of the lens of the laser assembly 102 and may vary. The top side 702 may also have one or more gas supply inlets 714 that are radially inwardly of one or more evacuation ports 716. FIG. 8 depicts a view of a bottom side 800 of the debris removal apparatus 700 in accordance with some embodiments. The bottom side 800 of the debris removal apparatus 700 has a second opening 806 with a second diameter 802 greater than the first diameter 710. In some embodiments, the second diameter 802 may be from approximately 70 mm to approximately 150 mm. In some embodiments, the outer diameter 804 of the debris removal apparatus 700 may have a diameter of approximately 75 mm to approximately 160 mm. The gas supply inlets 714 are fluidly connected to a first plenum 1002 (see FIG. 10) that supplies gas to a plurality of gas nozzles 810. The cylindrical main body 704 forms a debris removal volume where both active purging and debris removal can occur within the same volume close to the process point 112.

Figure 9:
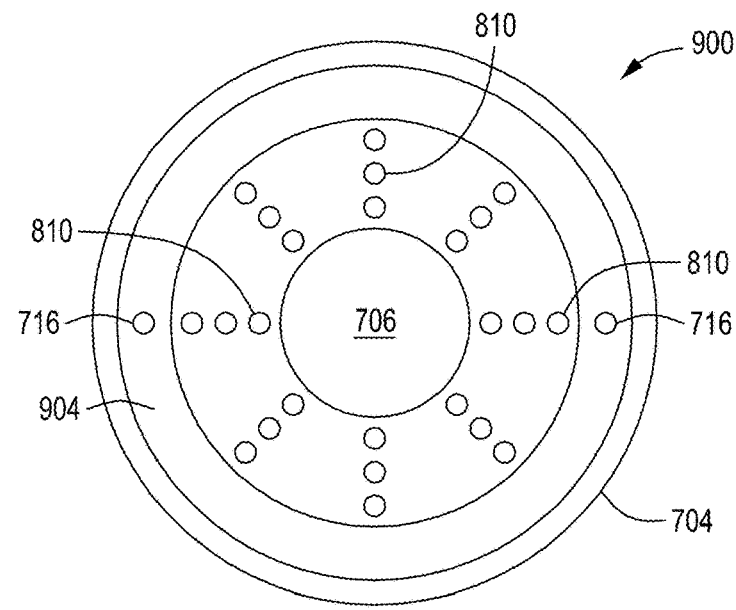
FIG. 9 depicts a bottom view of a mask trench debris removal apparatus in accordance with some embodiments of the present principles.

FIG. 9 depicts a bottom view of a debris removal apparatus 900 in accordance with some embodiments. The debris removal apparatus 900 may be formed from a metallic or non-metallic material. In some embodiments, the debris removal apparatus 900 is formed from a metallic material such as, but not limited to, aluminum and the like because the debris removal apparatus 900 is not subjected to high heat environments. The plurality of gas nozzles 810 may have any number of nozzles in any number of configurations and at the same or various angles relative to the process point 112. For example, the gas nozzles of FIG. 9 are arranged radially outwardly of the center of the debris removal apparatus 900. Each of the nozzles are configured to be angled towards (e.g., each nozzle may have a different angle) the process point 112 when the debris removal apparatus 900 is attached to the laser assembly 102 as depicted in the view 1000 of FIG. 10. The further a nozzle is radially outward, the lower the angle. In some embodiments, the evacuation ports 716 of FIG. 7 are fluidly connected to a channel 904. The channel 904 creates a negative pressure zone completely around the plurality of gas nozzles 810 to enhance gas and debris evacuation. The plurality of gas nozzles 810 provide gas flow streams 1004 that surround the process point 112, providing low-pressure high-volume gas flow to remove debris in the mask trench. The plurality of gas nozzles 810 enable optimal debris removal performance regardless of the direction of the trench formation during the mask patterning. By using high volume and higher angles (e.g. 75 degrees or more), a lower pressure (e.g., approximately 5 psi to approximately 15 psi) may be used as at least some of the nozzles may provide gas flow stream that directly reaches the bottom of the mask trench.

Figure 10:
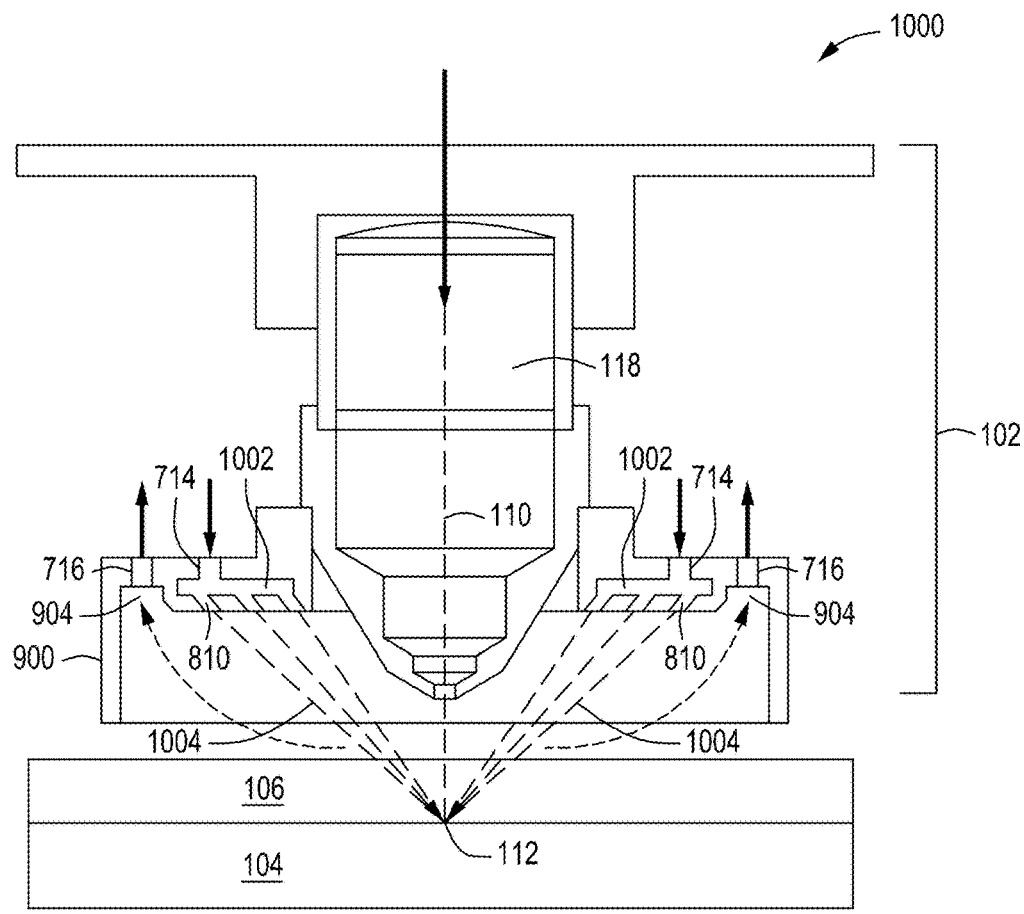
FIG. 10 depicts a cross-sectional view of a mask trench debris removal apparatus in-situ in accordance with some embodiments of the present principles.
Figure 11:
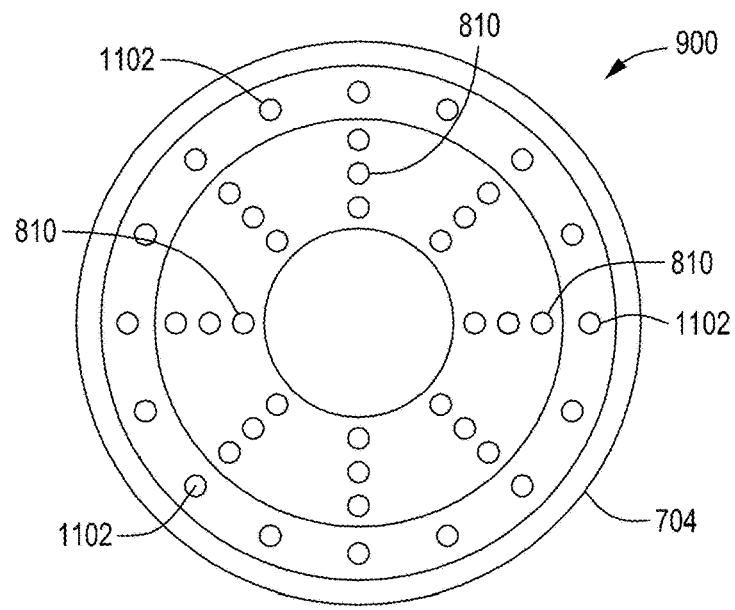
FIG. 11 depicts a bottom view of a mask trench debris removal apparatus in accordance with some embodiments of the present principles.
Figure 12:
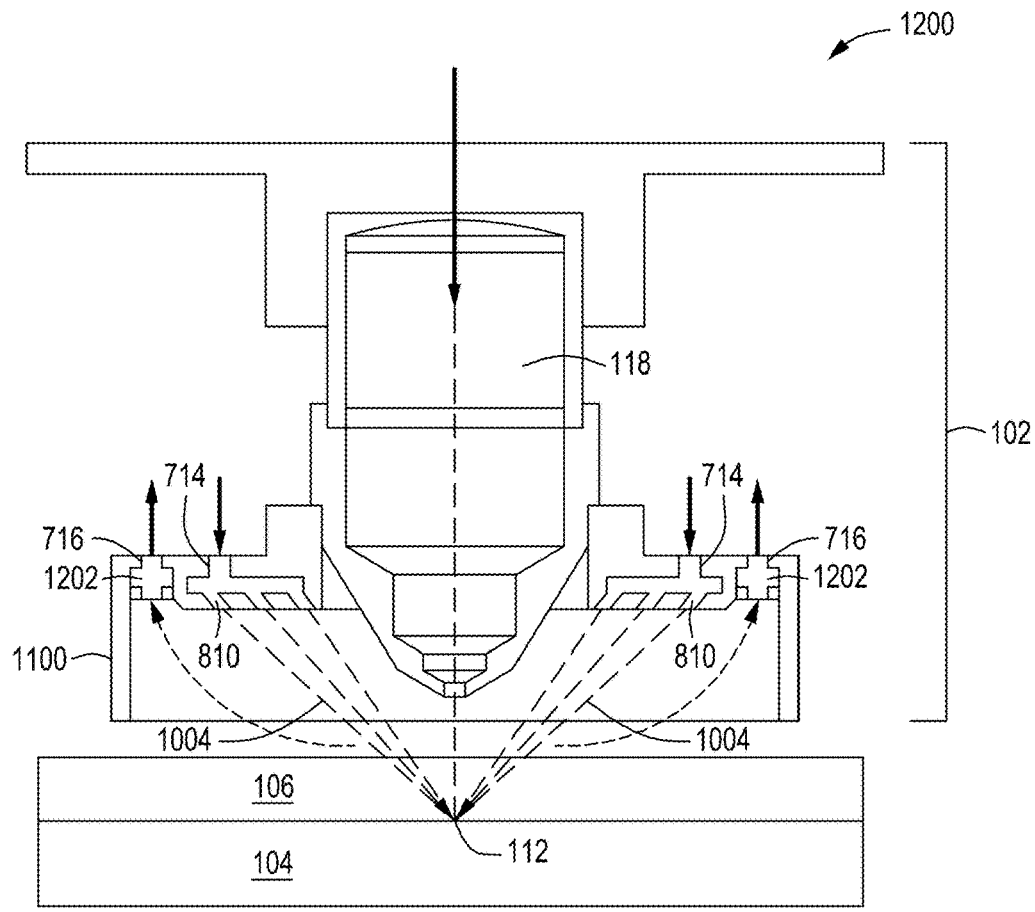
FIG. 12 depicts a cross-sectional view of a mask trench debris removal apparatus in-situ in accordance with some embodiments of the present principles.

FIG. 11 depicts a bottom view of a debris removal apparatus 1100 in accordance with some embodiments. The debris removal apparatus 1100 may be formed from a metallic or non-metallic material. In some embodiments, the debris removal apparatus 1100 is formed from a metallic material such as, but not limited to, aluminum and the like because the debris removal apparatus 1100 is not subjected to high heat environments. The plurality of gas nozzles 810 may have any number of nozzles in any number of configurations and at the same or various angles relative to the process point 112. For example, the gas nozzles of FIG. 10 are arranged radially outward of the center of the debris removal apparatus 1100. Each of the nozzles are configured to be angled towards the process point 112 when the debris removal apparatus 1100 is attached to the laser assembly 102 as depicted in the view 1200 of FIG. 12. The further a nozzle is radially outward, the lower the angle. In some embodiments, the evacuation ports 716 of FIG. 7 are fluidly connected to a second plenum 1202. Evacuation inlet ports 1102 are distributed around the plurality of gas nozzles 810 and form a negative pressure area around the plurality of gas nozzles 810 to remove gases and debris from inside the debris removal apparatus 1100. The distribution of evacuation inlet ports 1102 around the periphery inside the debris removal apparatus 1100 aids in evenly distributing the negative pressure area around the periphery.

Figure 14:
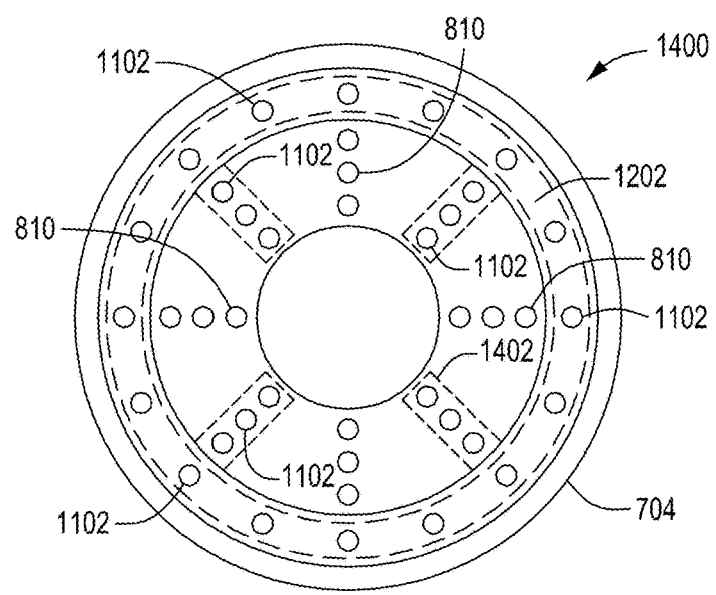
FIG. 14 depicts a bottom view of a variant of the mask trench debris removal apparatus of FIG. 7 in accordance with some embodiments of the present principles.

The plurality of gas nozzles 810 provide gas flow streams 1004 that surround the process point 112, providing low-pressure high-volume gas flow to remove debris in the mask trench. The plurality of gas nozzles 810 enable optimal debris removal performance regardless of the direction of the trench formation during the mask patterning. By using high volume and higher angles (e.g. 75 degrees or more), a lower pressure (e.g., approximately 5 psi to approximately 15 psi) may be used as at least some of the nozzles may provide gas flow stream that directly reaches the bottom of the mask trench. Lower pressures may also be used effectively as the debris processing volume is reduced in size. In a bottom view 1400 of FIG. 14, a variant of the debris removal apparatus 700 of FIG. 7 is depicted. The second plenum 1202 has extensions 1402 that encompass additional evacuation inlet ports to allow alternating patterns of evacuation ports and gas nozzles. One skilled in the art will appreciate that other intermixed patterns of gas nozzles and evacuation ports may be formed as well (e.g., alternating port functions as the ports radiate outward, etc. to form a mixture of gas nozzles interspersed with evacuation ports and similar).

FIG. 13 depicts a view of a mask patterning system 1300 in accordance with some embodiments. A debris removal apparatus 1302 is attached to the laser assembly 102. The debris removal apparatus 1302 may include, but is not limited to, the debris removal apparatus as depicted in FIGS. 3, 4, 7-12. The mask patterning system 1300 also includes a gas supply source 1304 that is fluidly connected to the debris removal apparatus 1302 via a first control valve 1306. The first control valve 1306 may be used to control the pressure and/or flow volume of the gas supplied to the debris removal apparatus 1302. An evacuation apparatus 1308 is also fluidly coupled to the debris removal apparatus 1302 via a second control valve 1310. The second control valve 1310 may be used to regulate the amount of negative pressure applied to the debris removal apparatus 1302 by the evacuation apparatus 1308. The evacuation apparatus 1308 may include a vacuum pump and the like.

The mask patterning system 1300 also includes a controller 1318 that can be used to implement a process recipe to regulate the volume and pressure of the gas supplied to debris removal apparatus 1302 and also to regulate the negative pressure applied to the debris removal apparatus 1302 by the evacuation apparatus 1308. The applied gas pressure and/or volume and/or the applied negative pressure may be adjusted based on the movement of the laser beam relative to the pattern mask. For example, increased gas volume may be implemented when the movement rate is increased and the negative pressure may also be increased to compensate for the increased gas volume. Similarly, decreased gas volume may be implemented when the movement rate is decreased and the negative pressure may also be decreased to compensate for the decreased gas volume. In some embodiments, the negative pressure may be increased by the controller when the gas pressure or volume is decreased. The relationship between debris removal, gas pressure, and evacuation pressure may be altered based on the composition of the debris material. The controller can then change the relationship between the parameters based on the type of debris being removed. In some embodiments, the mask patterning system 1300 may also include a debris sensor 1320 that monitors for debris in the mask trenches. Feedback from the debris sensor 1320 may be used by the controller 1318 to further adjust the parameters until debris removal is optimized (minimal or no debris detected in mask trenches).

The controller 1318 controls the operation of the mask patterning system 1300 using direct control or alternatively, by controlling the computers (or controllers) associated with the apparatus of the mask patterning system 1300. In operation, the controller 1318 enables data collection and feedback from the respective apparatus and systems to optimize performance of the mask patterning system 1300. The controller 1318 generally includes a Central Processing Unit (CPU) 1312, a memory 1314, and a support circuit 1316. The CPU 1312 may be any form of a general-purpose computer processor that can be used in an industrial setting. The support circuit 1316 is conventionally coupled to the CPU 1312 and may comprise a cache, clock circuits, input/output subsystems, power supplies, and the like. Software routines, such as a method as described below may be stored in the memory 1314 and, when executed by the CPU 1312, transform the CPU 1312 into a specific purpose computer (controller 1318). The software routines may also be stored and/or executed by a second controller (not shown) that is located remotely from the mask patterning system 1300.

The memory 1314 is in the form of computer-readable storage media that contains instructions, when executed by the CPU 1312, to facilitate the operation of the semiconductor processes and equipment. The instructions in the memory 1314 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 15:
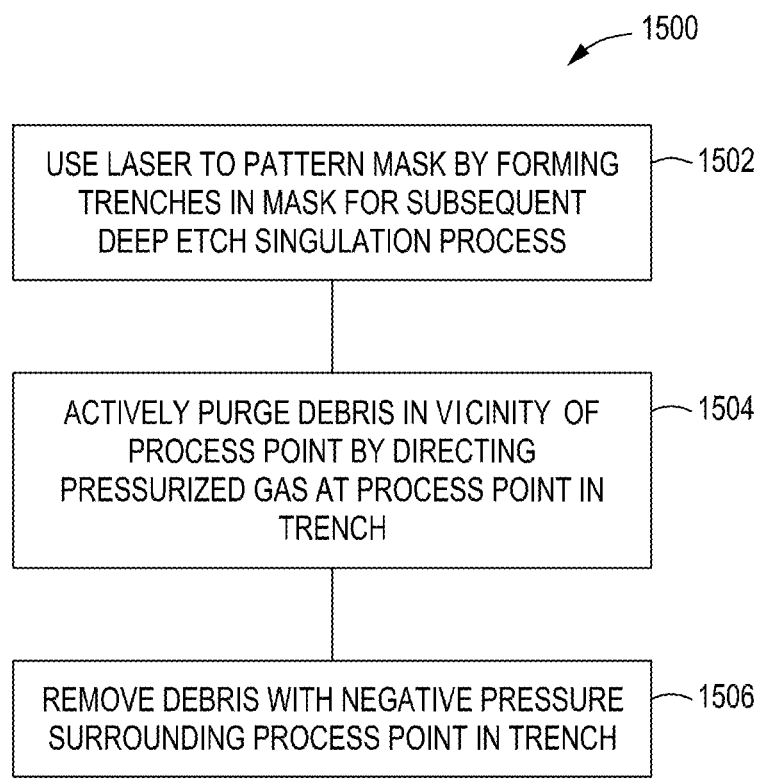
FIG. 15 is a method of removing debris from a pattern mask in accordance with some embodiments of the present principles.

FIG. 15 is a method 1500 of removing debris from a pattern mask in accordance with some embodiments. In block 1502, a laser is used to pattern a mask by lasing trenches into the mask. The mask pattern is used for a subsequent deep etch singulation process that effectively cuts a wafer into separate pieces or dies. In some embodiments, a femtosecond laser is used to create the fine lines or streets on the mask. In block 1504, pressurized gas is directed at the process point to actively purge debris from a mask trench. In some embodiments, the supplied gas may be at an ambient temperature and/or filtered to ensure no particulates are in the supplied gas. To actively purge the debris from the mask trench, the volume of the gas, the pressure of the input gas, the negative pressure of the evacuation ports, and/or the direction of the input gas (angle relative to the process point) may be varied.

The inventors have found that if the gas flow is directed at the processing point, the materials that are vaporized by the laser can be removed before the materials have a chance to solidify or amalgamate with other particles and stick to the trench sidewalls or floors. Lower gas flow angle values may result in a majority of the directed gas to flow over the mask trench rather than into the mask trench. Debris and gases within the mask trench should have a departure angle with a high angle value as well so that the debris and gases can escape out of the mask trench. The inventors have found that higher angles incident to the process point more efficiently remove debris and gases from the mask trench. In some embodiments, the higher angle values also allow the gas flow and extraction to be closer to the processing point (increasing efficiency of the gas flow and debris removal) and allow the size of the debris removal apparatus to be physically smaller. As noted above, in some embodiments, the gas flow angle may be from approximately 60 degrees to less than approximately 85 degrees. In some embodiments, the gas flow angle may be from approximately 75 degrees to less than 90 degrees.

The inventors have also found that the pressure of the gas flow directed at the processing point can damage the mask. The interface between the wafer and the mask can be easily damaged by directing high pressure gas at the sides of the mask trench or at the mask-wafer interface. In some cases, the mask may be delaminated from the wafer surface by the pressurized gas flow. The inventors have found that if the gas pressure is kept low, damage to the mask can be avoided. In some embodiments, the gas pressure is greater than zero to approximately 100 psi. In some embodiments, the gas pressure is approximately 5 to approximately 50 psi. In some embodiments, the gas pressure is approximately 5 psi to approximately 30 psi. In some embodiments, the gas pressure is approximately 5 psi to approximately 15 psi. The lower the pressure used, the less likely the mask will be damaged. The pressure should be adjusted to a level sufficient to remove debris but no higher.

The type of gas utilized may also have a direct effect on the pressure used to prevent damage to the mask. If the gas reacts with the laser or the mask material or if the gas contains moisture (the mask is water soluble in some instances), the mask may sustain damage and the pressure should be lowered to reduce the damage to the mask. The inventors have found that inert gases such as, but not limited to, argon gas or nitrogen gas and the like may be used without damaging water soluble mask materials. Gas flow volume may also be increased to keep the gas pressure as low as possible. The inventors have also found that particulates in the gas may also cause damage to the mask. In some embodiments, the gas is filtered to ensure that the supplied gas contains no particulates. In some embodiments, the gas temperature at the process point 112 is also maintained high enough such that no particulates are formed in the gas due to low temperatures (e.g., frozen particles). In some embodiments, the gas temperature is maintained at approximately-25 degrees Celsius to approximately 100 degrees Celsius. In some embodiments, the gas temperature is maintained at approximately ambient temperature.

In block 1506, debris and gases are removed surrounding the pressurized gas flow with negative pressure from an evacuation source. The negative pressure allows the debris and gases to be quickly removed from around the process point in the mask trench. In some embodiments, the negative pressure is approximately 0 kPa to approximately −85 kPa and, preferably approximately −50 kPa. As noted above, creating a clean mask trench with a single laser pass is critical to providing precise and accurate mask patterns for subsequent deep etch singulation processes. In some embodiments, the negative pressure may be achieved via an angled port in a debris removal apparatus. The angle for the port may be from approximately 30 degrees to less than 90 degrees. With extraction, the amount of the angle is less critical than the angle of the gas flow.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of a patterning a mask on a wafer, comprising:

forming a mask layer on the wafer;
forming a pattern in the mask layer using a laser beam from a laser assembly, wherein the pattern is configured to allow singulation of the wafer by deep etching, wherein the laser assembly forms at least one trench in the mask layer with the laser beam, and wherein the laser beam has a process point at a bottom of the at least one trench;
directing one or more gas nozzles that flow a pressurized gas at the process point in the at least one trench as the pattern is formed, wherein the one or more gas nozzles form a gas flow angle relative to the process point; and
evacuating debris from the at least one trench using at least one area of negative pressure, wherein gas flow from the one or more gas nozzles and the at least one area of negative pressure are in fluid contact and are confined within a cylindrical housing, wherein the cylindrical housing has a partially enclosed end distal to the process point that is sealed by and attached to the laser assembly via an opening in the partially enclosed end, and wherein the cylindrical housing moves in conjunction with the laser assembly above the process point.

2. The method of claim 1, wherein the gas flow angle is approximately 60 degrees to approximately 85 degrees.

3. The method of claim 1, wherein the gas flow angle is approximately 75 degrees to less than 90 degrees.

4. The method of claim 1, wherein the pressurized gas is at a pressure of approximately 5 psi to approximately 30 psi.

5. The method of claim 1, wherein the pressurized gas is at a pressure of approximately 5 psi to approximately 15 psi.

6. The method of claim 1, wherein the pressurized gas is supplied by a gas source at an ambient temperature.

7. The method of claim 1, wherein the at least one area of negative pressure is positioned opposite the one or more gas nozzles in the cylindrical housing.

8. The method of claim 1, wherein the at least one area of negative pressure is an annular area around an inner circumference of the cylindrical housing at the partially enclosed end.

9. The method of claim 1, wherein the pressurized gas is an inert gas.

10. The method of claim 9, wherein the pressurized gas is argon gas or nitrogen gas.

11. The method of claim 1, wherein the one or more gas nozzles are positioned in the partially enclosed end of the cylindrical housing in an annular orientation and configured to surround the process point with gas flow.

12. The method of claim 1, wherein a plurality of negative pressure areas is interspersed with a plurality of gas nozzles.

* * * * *